United States Patent
Xue et al.

(10) Patent No.: US 10,121,925 B2
(45) Date of Patent: Nov. 6, 2018

(54) THIN FILM PHOTOVOLTAIC DEVICES WITH MICROLENS ARRAYS

(75) Inventors: Jiangeng Xue, Gainesville, FL (US); Jason David Myers, Gainesville, FL (US); Sang-Hyun Eom, Kyunggi-do (KR)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 243 days.

(21) Appl. No.: 13/704,651

(22) PCT Filed: Jun. 17, 2011

(86) PCT No.: PCT/US2011/040900
§ 371 (c)(1),
(2), (4) Date: Dec. 17, 2012

(87) PCT Pub. No.: WO2011/160031
PCT Pub. Date: Dec. 22, 2011

(65) Prior Publication Data
US 2013/0092229 A1    Apr. 18, 2013

Related U.S. Application Data

(60) Provisional application No. 61/356,283, filed on Jun. 18, 2010.

(51) Int. Cl.
*H01L 31/052*    (2014.01)
*H01L 31/054*    (2014.01)
(Continued)

(52) U.S. Cl.
CPC .......... *H01L 31/0543* (2014.12); *B82Y 10/00* (2013.01); *G02B 3/0031* (2013.01);
(Continued)

(58) Field of Classification Search
CPC ............. H01L 31/0524; H01L 31/0543; H01L 31/0392; H01L 31/02327; H01L 31/0216;
(Continued)

(56) References Cited

U.S. PATENT DOCUMENTS 4,554,727 A    11/1985    Deckman et al.
5,442,482 A *   8/1995    Johnson ............... G02B 3/0031
                                                                   359/619
(Continued)

FOREIGN PATENT DOCUMENTS

WO    WO 2008-145176    * 12/2008
WO    WO 2009107943 A2 *  9/2009    ........... G02B 3/0043

OTHER PUBLICATIONS

Refraction of light; science learning hub; http://sciencelearn.org.nz/Contexts/Light-and-Sight/Science-Ideas-and-Concepts/Refraction-of-light; pp. 1-4; published Apr. 26, 2012.*

(Continued)

*Primary Examiner* — Edward J. Schmiedel
(74) *Attorney, Agent, or Firm* — Saliwanchik, Lloyd & Eisenschenk

(57) ABSTRACT

Textured transparent layers are formed on the incident light receiving surface of thin film solar cells to increase their efficiency by altering the incident light path and capturing a portion of the light reflected at the MLA. The textured transparent layer is an array of lenses of micrometer proportions such as hemispheres, hemi-ellipsoids, partial-spheres, partial-ellipsoids, cones, pyramids, prisms, half cylinders, or combinations thereof. A method of forming the textured transparent layer to the light incident surface of the solar cell is by forming an array of lenses from a photocurable resin and its subsequent curing. The photocurable resin can be applied by inkjet printing or can be applied by roll to roll imprinting or stamping with a mold.

12 Claims, 12 Drawing Sheets

(51) Int. Cl.
 B82Y 10/00 (2011.01)
 G02B 3/00 (2006.01)
 G02B 5/04 (2006.01)
 H01L 31/0216 (2014.01)
 H01L 31/0392 (2006.01)
 H01L 51/44 (2006.01)
 H01L 31/0232 (2014.01)
 H01L 31/18 (2006.01)
 H02S 40/22 (2014.01)
 H01L 51/00 (2006.01)
 H01L 51/42 (2006.01)

(52) U.S. Cl.
 CPC ........... *G02B 3/0043* (2013.01); *G02B 5/045* (2013.01); *H01L 31/02168* (2013.01); *H01L 31/02327* (2013.01); *H01L 31/0392* (2013.01); *H01L 31/03921* (2013.01); *H01L 31/03923* (2013.01); *H01L 31/03925* (2013.01); *H01L 31/054* (2014.12); *H01L 31/18* (2013.01); *H01L 51/447* (2013.01); H01L 51/0036 (2013.01); H01L 51/0046 (2013.01); H01L 51/0047 (2013.01); H01L 51/0078 (2013.01); H01L 51/426 (2013.01); H01L 51/4253 (2013.01); H02S 40/22 (2014.12); Y02E 10/52 (2013.01); Y02E 10/541 (2013.01); Y02E 10/549 (2013.01)

(58) Field of Classification Search
 CPC ............ H01L 31/02168; H01L 51/447; G02B 3/0006; G02B 3/0056
 See application file for complete search history.

(56) References Cited

U.S. PATENT DOCUMENTS

| 6,168,968 | B1 | 1/2001 | Umemoto et al. | |
|---|---|---|---|---|
| 6,534,336 | B1 | 3/2003 | Iwane et al. | |
| 2003/0072080 | A1* | 4/2003 | Ariyoshi | G02B 3/0031 359/485.02 |
| 2003/0121542 | A1 | 7/2003 | Harneit | |
| 2003/0227688 | A1* | 12/2003 | Houlihan et al. | 359/619 |
| 2004/0103938 | A1* | 6/2004 | Rider | 136/259 |
| 2006/0037640 | A1 | 2/2006 | Miura | |
| 2007/0062573 | A1* | 3/2007 | Ferri et al. | 136/251 |
| 2007/0111368 | A1* | 5/2007 | Zhang et al. | 438/99 |
| 2007/0169805 | A1* | 7/2007 | Sasaki et al. | 136/256 |
| 2008/0105303 | A1 | 5/2008 | Oswald et al. | |
| 2008/0223430 | A1* | 9/2008 | Krasnov | C03C 17/347 136/244 |
| 2009/0165856 | A1* | 7/2009 | Lee | B82Y 10/00 136/261 |
| 2010/0051104 | A1* | 3/2010 | Lee | H01L 31/022425 136/261 |
| 2010/0126583 | A1* | 5/2010 | Lee | H01L 31/02168 136/256 |
| 2010/0186798 | A1* | 7/2010 | Tormen et al. | 136/246 |
| 2010/0294346 | A1* | 11/2010 | Frolov et al. | 136/252 |
| 2011/0061717 | A1* | 3/2011 | Kwon | H01L 31/048 136/246 |
| 2011/0259407 | A1* | 10/2011 | Kim | G02B 3/0056 136/255 |

OTHER PUBLICATIONS

Definition of Diameter by Merriam-Webster Dictionary; accessed and printed Aug. 6, 2017; https://www.merriam-webster.com/dictionary/diameter.*

Abdelsalam, M.E. et al., "Preparation of Arrays of Isolated Spherical Cavities by Self-Assembly of Polystyrene Spheres on Self-Assembled Pre-patterned Macroporous Films," *Advanced Materials*, Jan. 5, 2004, pp. 90-93, vol. 16, No. 1.

Tvingstedt, K. et al., "Trapping light with micro lenses in thin film organic photovoltaic cells," *Optics Express*, Dec. 22, 2008, pp. 21608-21615, vol. 16, No. 26.

* cited by examiner

Heat mold, press onto plastic substrate

Separate mold

Deposit transparent electrode, active layers, etc.

THIN FILM PHOTOVOLTAIC DEVICES WITH MICROLENS ARRAYS

CROSS-REFERENCE TO RELATED APPLICATIONS

This application is the U.S. national stage application of International Patent Application No. PCT/US2011/040900, filed Jun. 17, 2011, which claims the benefit of U.S. Provisional Application Ser. No. 61/356,283, filed Jun. 18, 2010, the disclosures of which are hereby incorporated by reference herein in their entireties, including any figures, tables, or drawings.

The subject invention was made with government support under the National Science Foundation, Grant No. ECCS-0644690, and U.S. Department of Energy Solar Energy Technologies Program, Grant No. DE-FG36-08GO18020. The government has certain rights to this invention.

BACKGROUND OF INVENTION

The pursuit of energy sources that do not require the use of a carbon based fuel, particularly a hydrocarbon, is vigorously pursued. Solar cells are an important technology towards such ends. Solar energy is abundant as the earth receives the equivalent energy from the sun in about an hour as is generated by man in a year. The cost to implementing solar energy involves many factors, but a predominate factor is the efficiency of a solar cell to convert as much of the solar energy reaching the surface of the solar cell to electrical energy as possible. Although many types of solar cells exist, generally differentiated by the nature of the photoactive material used to generate free electrical charge carriers in the cell, the performance of a solar cell of any given photoactive material can vary by a significant amount depending on various designed factors.

Solar concentrators are one way by which performance of a photovoltaic device can be enhanced. In this manner, the light over a given area is focused and directed to a smaller area cell such that more energy than that possible without the focusing can be absorbed by the cell. Solar concentrators are not conducive for use with large-area solar cells as the concentrator would simply divert light directed from one portion of the solar cell to another.

Performance improvements can be achieved by enhancing the efficiency of any given type of solar cell by reducing the optical loss because of reflection from the exposed surface or due to non-absorbance of the light in the solar cell. Anti-reflection coatings enhance solar cell performance at different angles of light incidence. The anti-reflection coating is chosen to have a thickness where the wavelength in the coating material is one quarter the wavelength of the incoming wave. The anti-reflection coating minimizes reflection when its refractive index is the geometric mean of the materials on either side of the coating. Reflectivity can be reduced over a range of wavelengths by including a plurality of anti-reflection layers.

Any roughening of the exposed surface reduces reflection by increasing the probability that reflected light is also projected onto a portion of the surface. Single crystalline silicon wafers can be textured by etching anisotripically along the faces of its crystal planes to leave random sized extended pyramids or even regular inverted pyramids at the silicon surface. Multicrystalline wafers can be textured by photolithography or mechanically using saws or lasers to cut the surface into an appropriate shape.

In contrast, there are limited options to improve light trapping in thin-film solar cells. Many thin-film solar cell technologies have been developed, including devices based on inorganic semiconductors such as amorphous silicon, nano-, micro-, or poly-crystalline silicon, CdTe, and $Cu(In_xGa_{1-x})Se_2$. With a thickness of a few microns or less, thin-film solar cells do not support traditional light-trapping techniques, such as the surface texturing of above. Subwavelength texturing required for thin silicon layers, in addition to increasing the surface area, increases the amount of electrically active centers or defects at the surface. As a result, surface-recombination losses at the transparent conducting oxide/silicon interface increases and the performance of the solar cells decreases. Thus, a novel and relatively simple method is required to enhance light trapping with minor modification and/or addition to the processing steps is desirable.

Another type of emerging thin-film solar cell technology is based on organic semiconductors, including small molecular weight organic compounds (or small molecules) and conjugated polymers. These materials can be easily processed from vacuum (for small molecules) and from solutions (for polymers). Conjugated polymers can also be combined with colloidal inorganic nanoparticles to form hybrid organic-inorganic solar cells that retain the solution processability of polymers. The reflection losses of the incident light in these organic and hybrid solar cells are generally less than in those inorganic semiconductor-based thin film solar cells. This is because the index of refraction for these organic materials, and the typical substrates (glass or plastics) for these organic and hybrid solar cells, is generally much lower than that of the inorganic semiconductors. However, organic semiconductors also possess significantly lower charge carrier mobility, typically 1 $cm^2/V \cdot s$ or less, compared, for example, to about 1400 $cm^2/V \cdot s$ for electrons in crystalline silicon. Therefore, there exists a trade-off between light absorption and charge collection, as thick films are needed to absorb the incident photons as much as possible, but thin films are more advantageous for complete collection of the photogenerated charge carriers. Hence a means to improve the light absorption efficiency in thin films, while possibly reducing reflection loss, is desired for increasing the overall solar energy conversion efficiency.

BRIEF SUMMARY

Embodiments of the invention are directed to a thin film solar cell having a transparent microlens array (MLA) comprising an array of lenses that are 1 to 1,000 μm in cross-section deposited on an essentially flat transparent surface where the lenses occupy at least 90% of the flat surface. The flat surface can be a transparent substrate such as a sheet of glass or plastic upon which the layers of the solar cells have been formed or the flat surface can be a transparent electrode. Transparent electrodes, upon which the MLA can be deposited, include those comprising: tin-doped indium oxide (ITO); fluorine-doped tin oxide (FTO); aluminum-doped zinc oxide (AZO); gallium doped zinc oxide (GZO); graphene; carbon nanotubes; conductive polymers, such as polyethylenedioxythiophene: polystyrenesulfonate (PEDOT:PSS); metal oxide/metal/metal oxide multilayers, such as $MoO_x/Au/MoO_x$; metallic gratings; or metallic nanowire networks. The lenses of the MLAs can comprise hemispheres, hemi-ellipsoids, partial-spheres, partial-ellipsoids, cones, pyramidal prisms, half cylinders or any combination thereof. The lenses can possess identical or nearly identical cross-sections, or they can display a plurality of cross-sections. In embodiments of the invention, the texture surface layer comprises a photo-cured resin, such as those commercially available as optical adhesives. The solar cells can have active layers that are comprised of amorphous silicon, inorganic semiconductor thin films, organic dyes, or organic polymers and small molecules, or hybrid organic-inorganic thin films such as blended polymer:colloidal nano-particle materials. The electrode distal to the MLA layer can be reflective, for example it can comprise a reflective metal.

Other embodiments of the invention are directed to methods of forming a transparent MLA on a flat surface of a thin film solar cell. The method involves fixing and adhering microlenses to a transparent substrate or a transparent electrode by forming an MLA comprising a photocurable transparent resin surface and curing the transparent resin by irradiation with electromagnetic radiation or upon heating. In one embodiment of the invention, the MLA can be formed by inkjet printing transparent resin lenses of a desired shape on the surface of the transparent substrate or electrode. In another embodiment of the invention the MLA is formed by depositing a layer of a transparent resin of the surface and contacting the layer of resin with a mold that acts as a template of the microlenses. The mold can be a flat stamp or a mold for roll to roll imprinting where the irradiation can occur before or after removal of the mold from the lenses. In another embodiment of the invention transparent inorganic nanoparticles, such as $TiO_2$, $ZrO_2$, $CeO_2$, and lead zirconate tinate (PZT) nanoparticles, may be incorporated in the photocurable transparent resin to increase the index of refraction of the MLA.

In other embodiments of the invention a solar cell is formed by molding a MLA into a transparent substrate and subsequently depositing a transparent electrode on the face of the substrate opposite the MLA. The substrate can be a thermoplastic where a surface of the sheet is contacted with a mold having a template of a MLA, where the mold and/or the thermoplastic can be heated and contacting can be carried out with pressure applied to form the microlenses on the thermoplastic sheet. In one embodiment of the invention, the mold having a template for the MLA is filled with a molten glass to yield a glass substrate with a MLA. In another embodiment of the invention, the mold having a template of a MLA is filled with a transparent thermosetting resin and cured to yield a substrate with a MLA.

DETAILED DISCLOSURE

Embodiments of the invention are directed to a microlens array (MLA) and methods for its formation on the light exposed surface, often referred to as a top or front surface, of a thin-film solar cell such that the light absorption is enhanced and reflection loss is reduced. The MLA can be generated and applied economically to a large surface area device. The MLA can be formed using a low cost material with a low cost scalable method on large area thin film solar cells. The MLA can be an array of lenses with micrometer dimensions, including lenses (for example hemispherical, other hemi-ellipsoidal or partial ellipsoidal), cones, pyramids (for example triangular, square, or hexagonal), prisms, half cylinders, or any other shape or combination of shapes that will alter the path of incoming light relative to that of a flat surface where the lenses fill a significant portion, about 60% or more, of the surface. In embodiments of the invention the lenses can fill at least 65, 70, 75, 80, 85 or 90% of the surface. For example a surface with hexagonally close packed equally sized hemispheres can have the lenses occupying 91% of the surface. Other orientations of equal sized or differently sized lwnawa can result in other percentages of the surface being occupied by the lenses. Lenses do not have to be close packed and flat areas can reside between lenses. The lenses can be non-overlapping or overlapping. The array can be periodic, quasiperiodic, or random. Increases in the short-circuit current and power conversion efficiency of 20-30% or more can be achieved relative to solar cells having unmodified planar exposed surfaces. The light source proximal surface is a transparent electrode, for example: tin-doped indium oxide (ITO); fluorine-doped tin oxide (FTO); aluminum-doped zinc oxide (AZO); gallium doped zinc oxide (GZO); graphene, carbon nanotubes; conductive polymers such as polyethylenedioxythiophene:polystyrenesulfonate (PEDOT:PSS); metal oxide/metal/metal oxide multi-layers such as $MoO_x$/Au/$MoO_x$; thin metallic layers for example Au, Ag, or Al, metal gratings; and metallic nanowire networks. In many applications, the transparent electrode is covered by a non-conductive transparent material such as glass or a plastic. Embodiments of the invention can have the MLA applied to either the transparent electrode or a transparent material on the transparent electrode.

Figure 1:
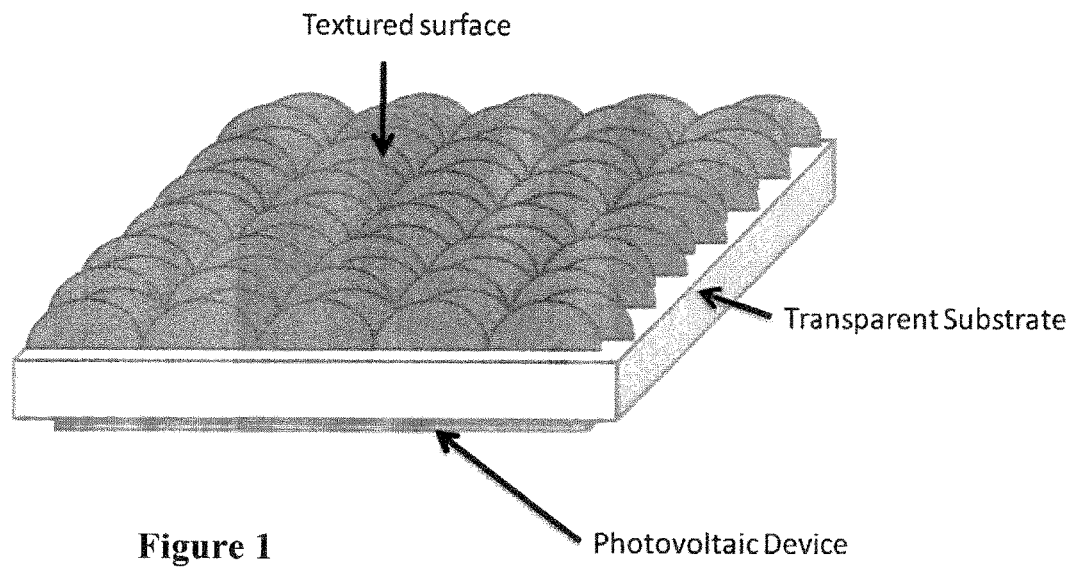
FIG. 1 shows a solar cell having a typical superstrate configuration where a substrate upon which the device is formed is transparent for presentation proximal to the incident light source comprising a microlens array (MLA) that is an array of approximately equal sized hemispherical microlenses in accordance with an embodiment of the invention.
Figure 2:
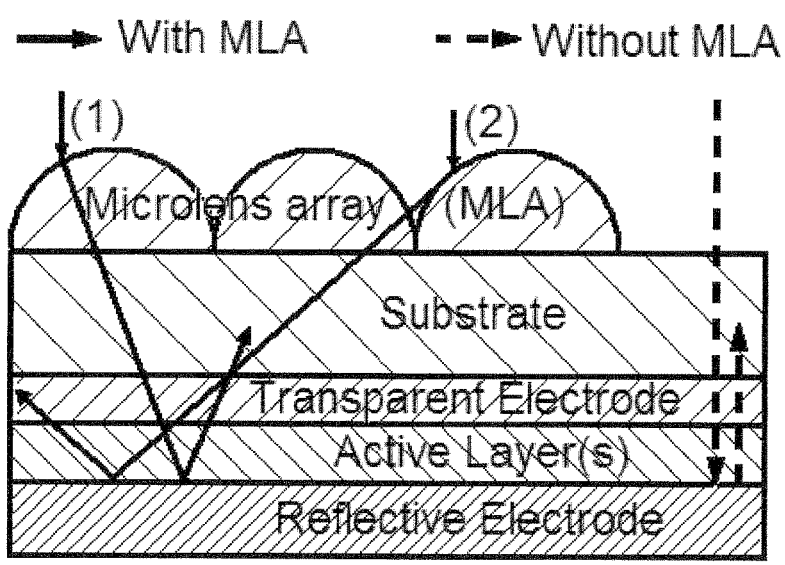
FIG. 2 shows a solar cell, according to an embodiment of the invention, having a MLA of hemispherical microlenses to refract incident light (solid lines) and to redirect reflected light into the active layer of the solar cell at an angle so as to increase the light path through the active layer in contrast to an area free of the MLA where incident light (dashed lines) is not refracted.

In one embodiment of the invention, as illustrated in FIG. 1, the MLA comprises hemispherical microlenses of, for example, 100 μm in diameter. Other lens diameters can be used, for example 1 to 1,000 μm, where, typically, the diameter of the lens does not exceed the thickness of the substrate upon which it is deposited. A dramatic decrease of surface reflectance, and an increase of the light path length within the active layer of an organic solar cell, results in a significant increase of light absorption and solar cell performance relative to that of a flat surface. For example, where a flat surface of a photovoltaic device has been directed towards the sun in an orientation where the surface is at a normal angle to incident sunlight, light is reflected directly back along its previous path (approximately 4% for common glass substrates) or transmitted through the surface with no change in direction. As shown in FIG. 2, this ray (dashed line) proceeds through the active layer of the device with a path length equal to the thickness of the active layer. When the MLA is applied, the ray has a different trajectory entering the active area of the device (shown as solid lines in FIG. 2), leading to an increased light path length and, therefore, promoting an enhanced light absorption.

The MLA can be of a single size, a continuous distribution of sizes, or comprised of a plurality of discrete sizes. For example, in one embodiment, non-overlapping spherical lenses are of nearly identical size and closed packed on a plane. In this manner up to about 90.7% of the surface is not normal to the incoming light. In another embodiment the non-overlapping lenses can be of two sizes where the voids of a closed packed orientation of the large lenses on the plane of the substrate are occupied by smaller lens, which increase the proportion of the surface occupied by lenses in excess of 91%. In like manner, smaller lenses can be constructed in the voids that result for the close packed distribution of two non-overlapping lenses to further increase the lens occupied surface. By having a surface of overlapping lenses, the proportion of lens covered surface can be effectively 100%. In embodiments of the invention microlenses cover about 60% or more of the surface.

In other embodiments of the invention the shape of the lenses can be cones or pyramids, where the angle of the feature's surface to the substrate's surface can be predetermined to optimize impingement of light reflected from one feature on another feature to minimize the loss of light by reflectance. Whereas like sized pyramids can be in a regular array that minimizes surfaces normal to the incoming light, cones can be overlapping or of multiple dimensions to have lenses covering nearly the entire surface.

Typical bulk heterojunction organic solar cells are intrinsically limited in the thickness of the active layer because photo-generated charge carriers have a mean collection length on the order of less than 100 nm prior to recombination, requiring that the active layer thickness is of that magnitude to optimize current per volume of active material. Materials that can be used in organic thin film solar cells, according to embodiments of the invention, can have various designs, such as bulk or planar heterojunction solar cells that employ electron donors such as: phthalocyanines of Copper, Zinc, Nickel, Iron, Lead, Tin, or other metals; pentacene; thiophenes such as sexithiophene, oligothiophene, and poly(3-hexylthiophene); rubrene; poly[2,6-(4,4-bis-(2-ethylhexyl)-4H-cyclopenta[2,1-b;3,4-b']dithiophene)-alt-4,7-(2,1,3-benzothiadiazole)] (PCPDTBT); 4,4-bis[N-(1-naphthyl)-N-phenyl-amino]biphenyl (NPD); Poly (vinylpyridines) such as poly[2-methoxy-5-(3',7'-dimethyloctyloxy)-1,4-phenylenevinylene (MDMO-PPV) and poly(1-methoxy-4-(2-ethylhexyloxy)-p-phenylenevinylene) (MEH-PPV); inorganic nanoparticles such as CdS, CdSe, and PbSe; and electron acceptors such as: fullerenes such as $C_{60}$ and $C_{70}$; functionalized fullerenes such as phenyl-$C_{61}$-butyric acid methyl ester ($PC_{61}BM$) and phenyl-$C_{71}$-butyric acid methyl ester ($PC_{71}BM$); graphene; carbon nanotubes; perylene derivatives such as 3,4,9,10-perylenetetracarboxylic-bis-benzimidazole (PTCBI), perylene-3, 4,9,10-tetracarboxylic-3,4,9,10-dianhydride (PTCDA), and perylene-3,4,9,10-tetracarboxylic-3,4,9,10-diimide (PTCDI); poly((9,9-dioctylfluorene)-2,7-diyl-alt-[4,7-bis(3- hexylthien-5-yl)-2,1,3-benzothiadiazole]-2,2-diyl) (F8TBT); and inorganic nanoparticles such as CdS, CdSe, PbSe, and ZnO. Exciton blocking layers such as: hathocuproine (BCP); ZnO; Bathophenanthroline (BPhen); and ruthenium(III) acetylacetonate (Ru(acac)$_3$) can be included with the active layer. Inorganic thin film solar cells, according to embodiments of the invention, can be constructed with: copper indium gallium diselenide (CIGS); copper zinc tin sulfides or selenides (CZT(S,Se)), II-VI or III-V compound semiconductors such as CdTe, CdS, and GaAs; and thin-film silicon, either amorphous, nanocrystalline, or black. Dye-sensitized solar cells are another form of thin-film solar cells that can be employed in an embodiment of the invention. Any other thin film solar cell can be incorporated with the MLAs according to embodiments of the invention For virtually all thin-film materials, the minimum optical path to absorb all incident light is much greater than the film thickness, for example, greater than 100 nm for organic-based thin films or greater than 1 μm for inorganic semiconductor thin films. The MLAs according to embodiments of the invention are not used to focus the light to a particular spot or area in the solar cell, rather the lenses modify the light path such that any ray striking the lenses undergoes refraction at an angle determined by vector normal to the surface that it impacts as indicated for the incident ray marked (1) in FIG. 2, which is a surface that has a low probability of being effectively flat along the curve of the lens. Therefore, the refracted light transmitted through the MLA will have a longer path through the underlying active layer than it otherwise would have at a normal flat surface because of the angle of refraction. Additionally, unlike a planar surface, as shown on the right of FIG. 2, where all light reflected at the proximal surface is lost to the device; a light ray reflected from the MLA is not necessarily lost, depending on the angle of reflection and shape of the surface, as illustrated for incident ray marked (2) in FIG. 2, for a microlens surface. Refracting the light through the device at an angle by the microlenses results in a greater path length through the active layer and increases the absorption probability of that light within the active layers, according to the equation:

$$A1-e^{-ad}$$

where a is the effective absorption coefficient of the active layer material and d is the path length. For normal light incidence, the light path length is just the film thickness, $t_a$, when there is no microlens. However if there is a microlens present, as shown in FIG. 2, the light path length becomes:

$$d=t_a/\cos \theta_a$$

where $\theta_a$ is the angle of the ray from the normal direction.

Figure 3:
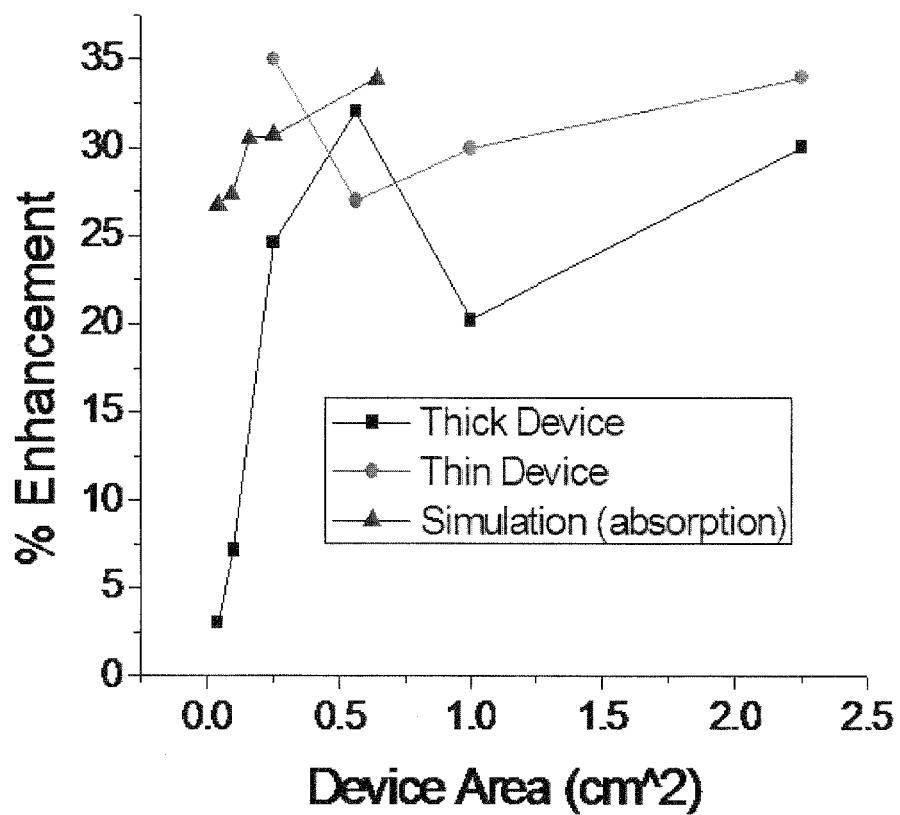
FIG. 3 is a plot of efficiency enhancement achieved for an organic solar cell as the surface area increases for a cell having a MLA where the illumination area exceeds that of the active layer in accordance with an embodiment of the invention.
Figure 4:
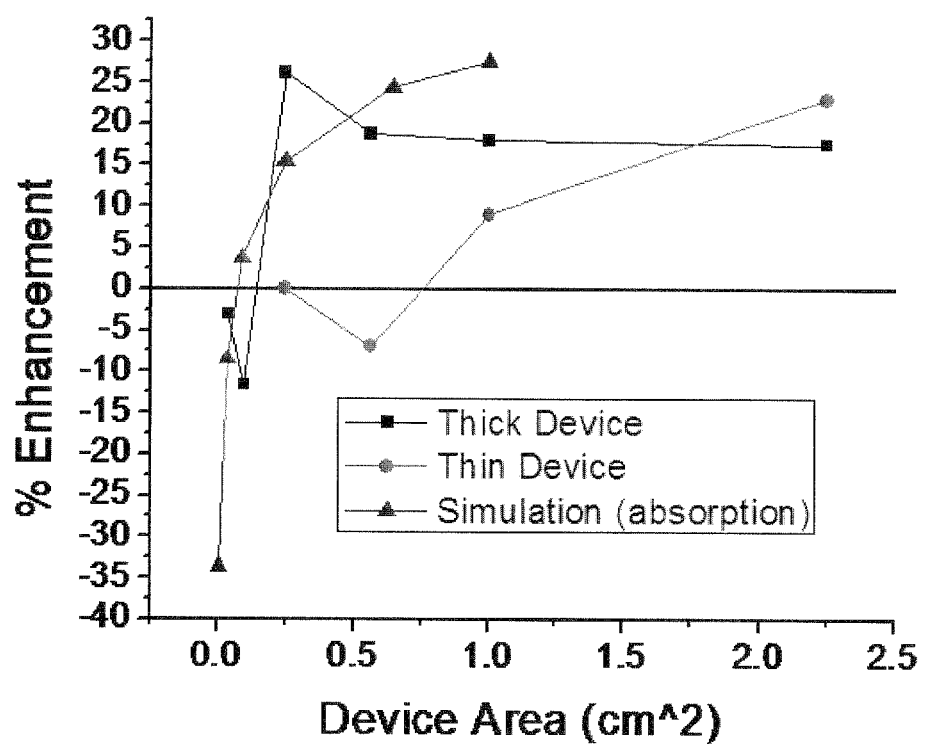
FIG. 4 is a plot of efficiency enhancement achieved for an organic solar cell as the surface area increases for a cell having a MLA where the illumination area is equal to that of the active layer in accordance with an embodiment of the invention.
Figure 5:
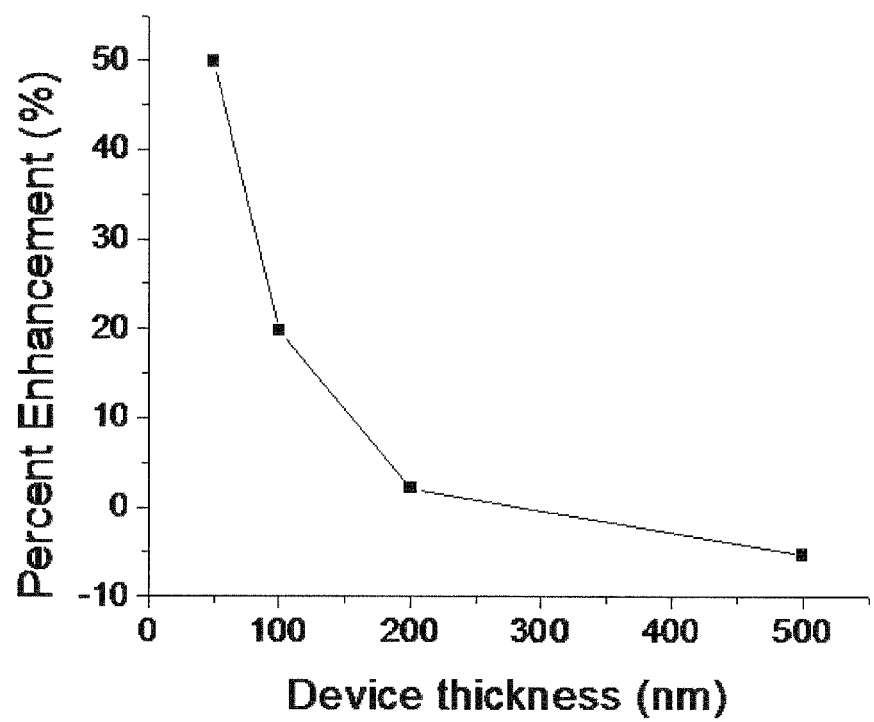
FIG. 5 is a plot of simulated efficiency enhancements achieved for organic solar cells having a MLA as the thickness of the active layer increases in accordance with an embodiment of the invention.

As shown in FIG. 1, the surface area of the MLA can be greater than the surface area of the photoactive layer of the device and can direct additional light into the active layer at an angle that imparts a greater path length. As can be seen in FIG. 3 for a device where the illumination area is greater than the area of the active layer, surface texturing results in a more effective device as the surface area of the device increases. The percentage of light lost is proportional to the perimeter of the photovoltaic device. The percentage of light lost becomes smaller as the device area increases faster than the perimeter length. As shown in FIG. 4, the increase of efficiency with surface area occurs even where the area of the MLA is equal to the area of the active layer. The device improvement by inclusion of the MLA is greatest for thinner active layer devices, as indicated in the graph shown in FIG. 5.

Other embodiments of the invention are directed to a method of forming a MLA on a solar cell. In one embodiment of the invention, the texture surface is amenable to formation by inkjet printing microlenses comprising a curable resin on a substrate. Methods and materials for producing a MLA by inkjet printing, including a method to impose a large contact angle to lenses so deposited, are disclosed in WO 2008/157604, published Dec. 24, 2008 and incorporated herein by reference. Arrays of lenses of desired shapes, sizes, patterns and overlap can be formed by controlling: the viscosity of the resin; the resins rate of curing; the time period between deposition of the feature and irradiation; and the mode of feature deposition.

Figure 6:
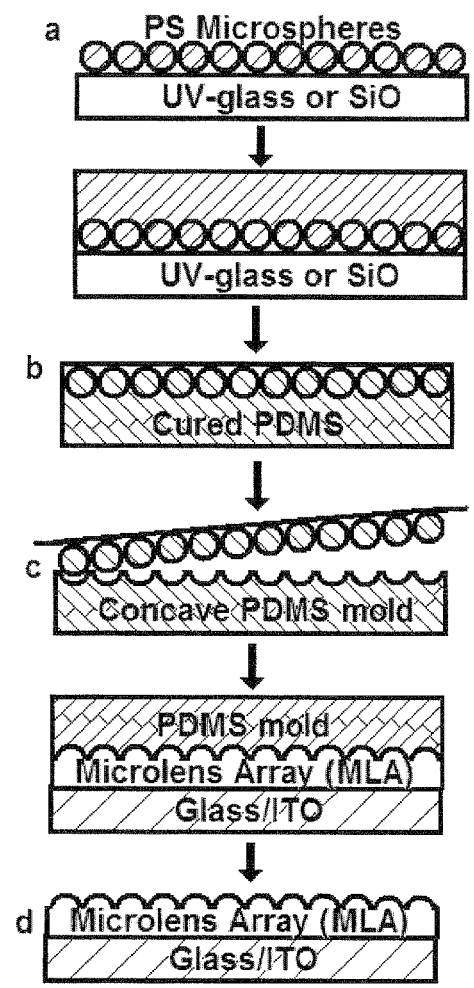
FIG. 6 is a schematic diagram illustrating the fabrication process of depositing a microlens array on a glass substrate in accordance with an embodiment of the invention.

In other embodiments of the invention, the MLA is formed by a roll to roll method using a mold or stamping with an optically transparent adhesive material for application to the transparent substrate to generate a MLA on a flat substrate. The mold or stamp can be generated by any method including: curing of a resin around a template, micromachining, laser ablation, and photolithography. The template can be removable or can be sacrificial, where the template can be dissolved or decomposed after formation of the lenses. The template can be formed by laser ablation, photolithography, other mechanical (scribing or drilling) micromachining, or replicated using an earlier generation mold or stamp before the end of its effective lifetime. For example, as shown in FIG. 6, a close packed array of nearly identical polystyrene spheres in a flat tray provides a template that can be covered by a silicone resin and subsequently cured to yield a mold formed when the silicone is fractured at approximately a height of one radius of the spheres upon delaminating the tray and spheres. A fluid curable resin can be placed in a tray with, for example, sacrificial spheres of a desired density such that they float as a monolayer extending a desired depth to give a desired feature orientation in the resin, wherein the sacrificial spheres can then be dissolved or decomposed after curing of the resin to form the mold. Alternately an array of hemispherical lenses, cones, pyramids, or prisms can be formed as a template by photolithograph, laser ablation, or mechanical micromachining. A template of an array of parallel aligned prisms or half cylinders can be formed by mechanical micromachining or laser ablation.

The mold or stamp is used to form the lenses when pressed against a layer of a transparent resin applied to a surface. The molds textured lenses can be the on the face of a roller or a stamp such that it can be systematically pressed onto the transparent resin in a manner that transfers the desired lenses to the resin. The transparent resin adheres to the surface but does not adhere to the mold. The resin is then cured to form a textured transparent solid layer having the lenses imparted by the mold. Curing can be done by photochemical activation, where the light is irradiated from the opposite surface of the substrate to the transparent resin or to the deposition side through the mold or to a viscous transparent resin after removal of the mold, within a period of time before any significant flow distortion of the textured lenses occurs. Light can be from any portion of the electromagnetic spectrum including visible light and ultraviolet radiation. Deposition can be carried out on a surface of the solar cell, for example a transparent electrode or a transparent substrate upon which the electrode and active layers had been deposited on the face opposite the molded transparent layer. Alternatively, the textured layer can be deposited to the substrate prior to deposition of electrode and active layers on the opposite face of the substrate. The transparent substrate can be rigid or flexible and can be an inorganic glass or an organic plastic or resin. The transparent resin can be an optical adhesive, which is generally photocurable with a sufficient viscosity to spread only slowly on a surface to which it is applied. In another embodiment of the invention, the transparent resin can be within a mold and a substrate placed onto the surface of the transparent resin followed by curing of the resin and removal of the substrate with the cured textured film from the mold.

Figure 7:
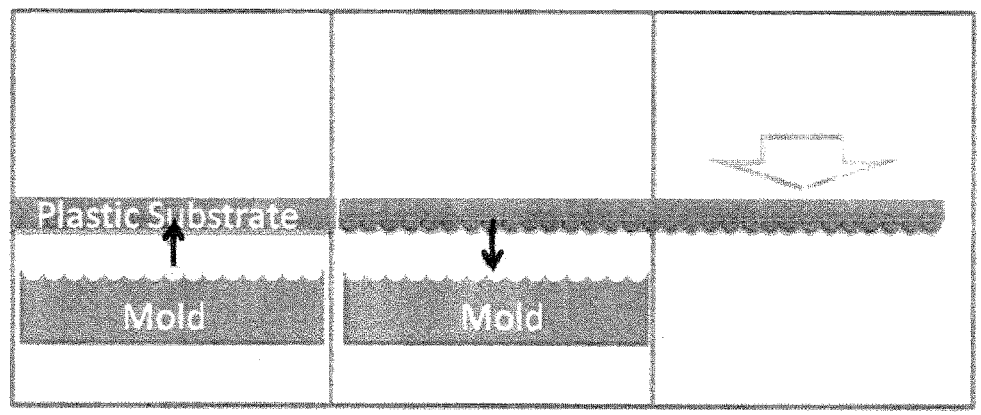
FIG. 7 is a schematic diagram illustrating a molding process to form an array of textured lenses into a face of a thermoplastic sheet according to an embodiment of the invention.

In another embodiment of the invention, a transparent substrate surface can be textured using a molding process to have the MLA on the substrate. For plastic substrates, this can involve roll-to-roll molding. A bare plastic substrate as a sheet coming off of a source roll, can be softened with heat, for example, by being contacted with a heated roller or other heated mold, or without contacting using a remote heat source, such as an infrared lamp prior to molding. In one embodiment of the invention, as shown in FIG. 7, the substrate is placed in physical contact with a rigid mold having a template of the textured lenses, which can be formed by a rolling method or other molding method. The mold or the substrate can be heated. The mold can be applied with pressure, for example by a roller on the other side of the plastic substrate, to imprint the lenses into the substrate, and to form the lenses on one substrate surface or face after the mold has been removed. The pressure can vary from that imposed by gravity by either the sheet resting on the mold, or the mold resting on the sheet, to pressures of even 1,000 psi as dictated by the materials chosen, the temperature during molding, and the desired rate of molding. One skilled in the art can readily envision the necessary temperature and pressures needed for molding any given thermoplastic substrate. Subsequently, the opposite non-textured face of the substrate is used as a first surface for the subsequent sequential deposition of a transparent electrode, one or more active layers, a counter electrode and any other necessary layers of the solar cell. The substrate can be a transparent thermosetting resin that is molded with one face being textured, where the resin can be cured thermally or photochemically. Textured transparent glass substrates can be formed by molding the lenses during the glass manufacturing process using a large-area flat mold having a template for the lenses for one face of the glass substrate.

Figure 8:
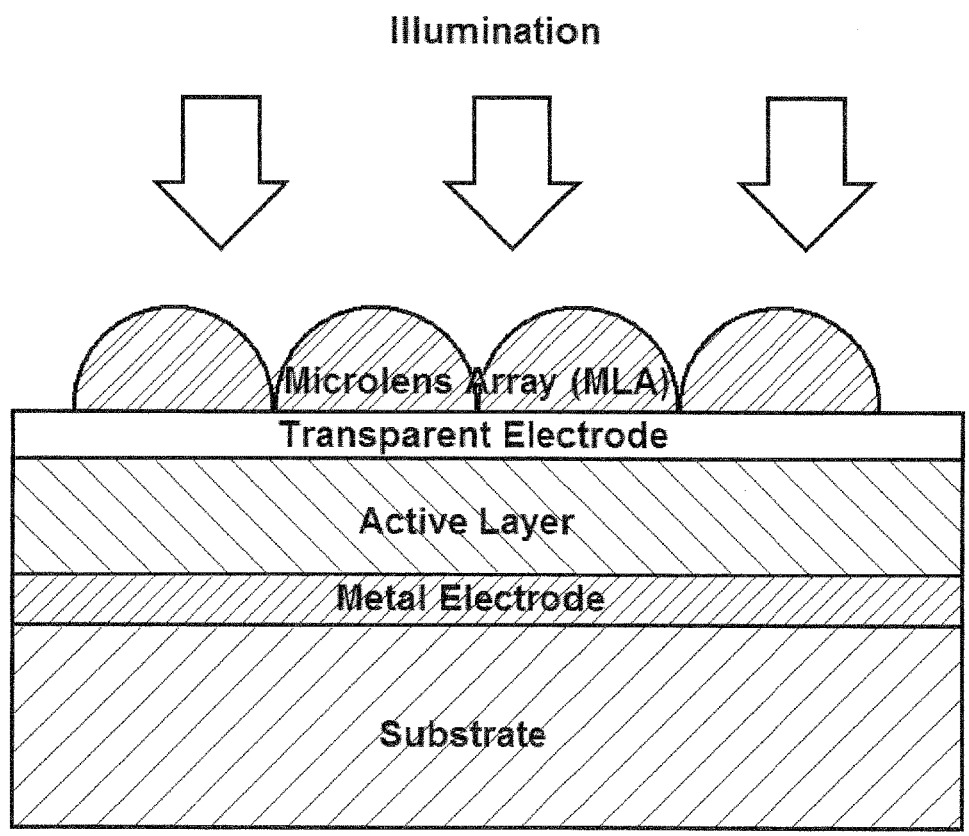
FIG. 8 is a schematic presentation of a solar cell having a superstrate configuration where a substrate upon which the device is formed is oriented distal to the incident light source comprising a MLA that is an array of approximately equal sized hemispherical microlenses in accordance with an embodiment of the invention.

In another embodiment of the invention, the surface texturing can be applied to the light incident surface of thin-film solar cells where the substrate upon which the device is formed is positioned distal to the incident light source as shown in FIG. 8. As shown in FIG. 8, the transparent electrode and the substrate, which can be opaque, are on the opposite sides of the active layer. Fabricating a MLA to the surface of the transparent electrode also leads to reduction of surface reflection and increase of length of the light paths in the active layers. In this embodiment of the invention, the enhancement in light absorption and, therefore, the overall solar cell efficiency occurs regardless of what transparent material is used to form the surface texture. As described above, the light path length inside the active layer is directly related to the angle of the light ray from the surface normal:

$$d = t_a / \cos \theta_a$$

where $t_a$ is the active layer thickness $\theta_a$ and is the angle of the light ray from the normal. With higher $\theta_a$, as in the manner illustrated in FIG. 2, the increase in the light path length and therefore the enhancement in light absorption is expected to be higher. Based on. Snell's Law of refraction, the value of $\theta_a$ depends on the index of refraction or refractive index of the active material, as in:

$$n_a \sin \theta_a = n_s \sin \theta_s$$

where $n_a$ and $n_s$ are the indices of refraction for the active material and the substrate, respectively, and $\theta_s$ is the angle of the light ray from the normal within the substrate. With a given $\theta_s$ within the substrate, a higher index of refraction for the active material leads to a smaller $\theta_a$ angle, and therefore a smaller increase in the light path length. Hence, to maximize the enhancement efficiency, use of transparent materials whose index of refraction is identical or close to that of the active material is advantageous.

Hence, polymer resins that are amenable to various molding, stamping, and/or printing methods are useful as the MLA. For organic or hybrid organic-inorganic solar cells, since the index of refraction of the organic or hybrid active layers is generally in the range of 1.6-2.0, using polymer resins or resins containing transparent inorganic nanoparticles, such as titanium oxide nanoparticles, having an index of refraction in the range of 1.4 to 2.0 allows achievement of large enhancements. For inorganic semiconductor based thin-film solar cells, the index of refraction of the active layer is generally much higher. For example, the index of refraction for amorphous silicon is about 4.7 at 588 nm; for $Cu(In_{1-x}Ga_x)Se_2$ the index of refraction is 2.3 to 3 at 600 nm, depending on the In to Ga ratio. In these cases, materials for the surface textures include transparent high-k dielectric materials, such as $HfO_x$ and $Ta_2O_5$ in the form of nanoparticles dispersed in a polymer resin matrix, and transparent ferroelectric materials, such as $BaTiO_3$ nanoparticles dispersed in a polymer matrix.

Materials and Methods

Device Fabrication: Devices were fabricated on glass substrates coated with a transparent indium tin oxide (ITO) (15Ω/□) layer, as the anode for a device. The substrates were cleaned by sonication with successive solutions of a surfactant (Tergitol NP10), deionized water, acetone, and isopropanol, and then treated with UV—generated ozone immediately before device fabrication. A boron subphthalocyanine chloride (SubPc) SubPc/C60 small molecule OPV devices were deposited in a high vacuum thermal vaporator (base pressure ~$10^{-7}$ Torr). After successive depositions of SubPc and C60 layers with a desired thickness, an exciton blocking layer of bathocuproine (BCP) and an aluminum cathode was deposited to complete the device.

Polymer:fullerene and hybrid devices: A hole extraction layer of poly(3,4-ethylenedioxythiophene):poly(styrenesulfonate) (PEDOT:PSS), Clevios P, layer was spin coated from an aqueous solution and subsequently annealed in air at 140° C. for 10 minutes. The active layers, and in some cases a ZnO nanoparticle layer, were spin coated in a nitrogen filled glovebox with water and oxygen concentrations less than 0.1 ppm. Semi-transparent P3HT:PCBM devices used an electron-selective cathode of ITO/ZnO nanoparticles and a vacuum-deposited trilayer anode of $MoO_3/Au/MoO_3$. P3HT (Rieke Metals) and PCBM (Nano-C) were used as received. All P3HT:PCBM films were deposited from chlorobenzene, at a ratio of 1:0.8 (by weight). P3HT:PCBM conventional devices without a ZnO layer were annealed for 30 minutes at 150° C. in the glovebox after aluminum deposition. For conventional devices with a ZnO optical spacer, the P3HT:PCBM film was first annealed in the glovebox for 10 minutes at 115° C. A ZnO layer was spin coated from an ethanol solution and the device annealed at 115° C. for an additional 10 minutes. Semi-transparent devices had a 40 nm thick electron-selective layer of ZnO spin coated on top of the ITO, annealed at 85° C. for 15 minutes in a nitrogen glovebox. The active layer was spin coated and annealed at 150° C. for 30 minutes in a glovebox.

High efficiency devices were spin coated from dichlorobenzene solutions of 22 mg/mL, 1:1 (by weight) PBnDT-DTffBT:PCBM on top of 40 nm thick PEDOT:PSS. After spin coating, the device were solvent annealed for 12 hours in a closed petri dish inside of the glovebox. A 1 nm LiF electron extraction layer and an aluminum cathode were deposited on the active layer to complete the device. Hybrid inorganic/organic devices were prepared by spin coating 9:1 (by weight) PCPDTBT (Luminescent Technologies):CdSe nanoparticles (~7 nm diameter) dissolved in a 9:1 chlorobenzene:pyridine on top of a 40 nm thick layer of PEDOT:PSS. Devices were annealed in a glovebox at 150° C. for 30 minutes prior to aluminum cathode deposition.

The device have an active areas of approximately 4 mm² using a crossbar geometry. Except where noted, a large area rear reflector (2.25 cm²) of vacuum-deposited aluminum was used to mimic the geometric characteristics of a large area device, and a 100 nm thick spin coated layer of Cytop fluoropolymer was used to insulate the reflector from the electrodes. Devices were encapsulated after fabrication to limit degradation during further characterization.

Microlens Array Fabrication: Microlens arrays were fabricated using a soft lithographic stamping technique using a UV curable optical adhesive. PDMS stamps were created using self assembled monolayers of 100 µm polystyrene microspheres (Duke Scientific), to which a PDMS precursor (Sylgard 184, Dow Corning) were poured onto the microspheres and cured in a vacuum oven at 60° C. for two hours. Microspheres were removed from the PDMS mold using a scotch tape liftoff. An optical adhesive (Norland Optical Adhesive #63) and a substrate were placed on the PDMS mold and cured with 365 nm UV light. PDMS stamps with array areas up to a few square inches can be readily fabricated in the laboratory and could be used several dozen times before they must be replaced. The MLAs have a contact angle of $(85\pm5)°$ and a fill factor close to the theoretical limit.

Device Characterization: Current-voltage characteristics were measured in the dark under simulated AM1.5G solar illumination from an Oriel Xe arc lamp using an Agilent 4155C semiconductor parameter analyzer. The power intensity was measured using a calibrated silicon reference cell with a KG 1 filter. External quantum efficiencies were measured using a Stanford Research Systems DSP830 lock-in amplifier with a Keithley 428 current amplifier. The monochromatic beam was produced with an Oriel tungsten lamp coupled to an Oriel ¼ meter monochromator. The monochromatic beam was chopped using a mechanical chopper, providing the reference signal to the lock-in amplifier. Differences between calculated $J_{SC}$ values, using EQE integration with the AM1.5G solar spectrum, and measured $J_{SC}$ values measured under simulated solar irradiance are less than 10%.

Figure 9:
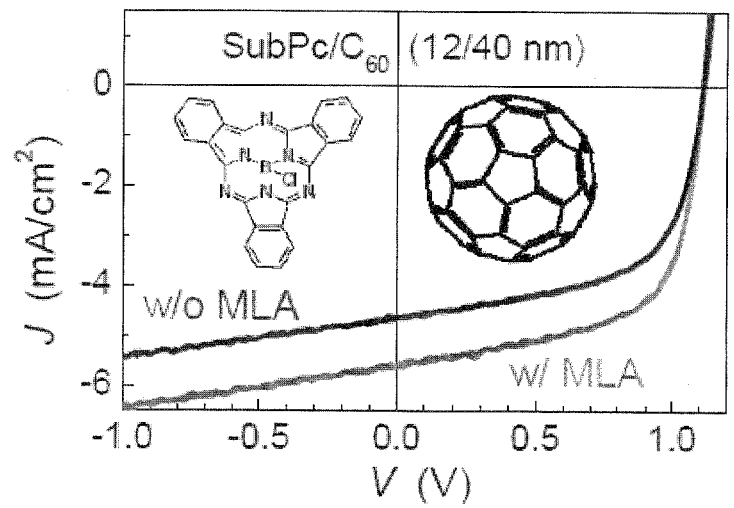
FIG. 9 is a current-voltage plot for a $SubPc/C_{60}$ device (12/40 nm) with a MLA according to an embodiment of the invention and without, where the structure of SubPc (left) and C60 (right) are shown.
Figure 10:
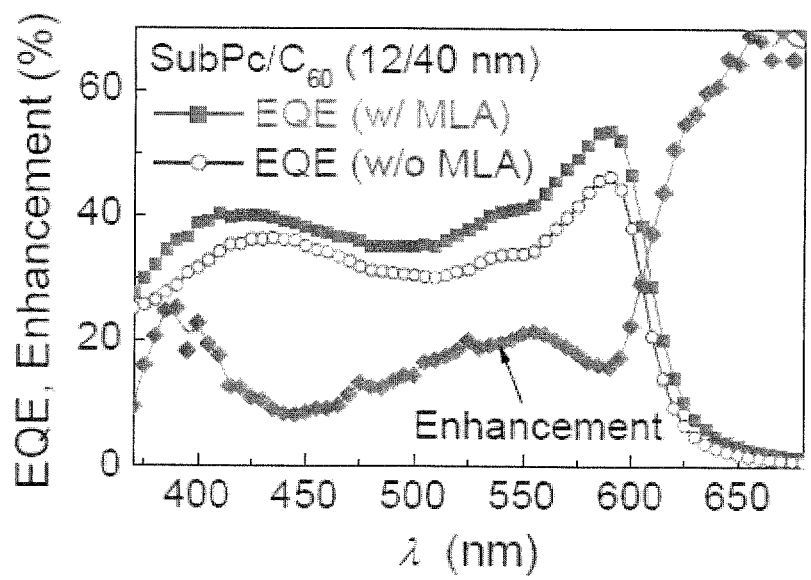
FIG. 10 are external quantum efficiency (EQE) spectra for the devices of FIG. 9 architecture, and a plot of the relative enhancement by inclusion of the MLA over the wavelength range of illumination.
Figure 11:
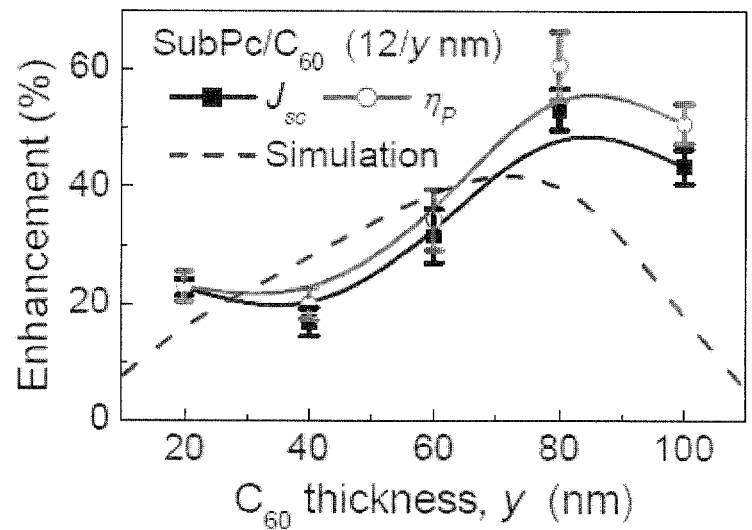
FIG. 11 are plots of the enhancement of $\eta_P$ and $J_{SC}$ with varying thickness of C60 layer in a $SubPc/C_{60}$ (12 nm/y nm) device for solar cells with MLAs according to an embodiment of the invention.

FIG. 9 shows the current-voltage (J-V) characteristics of a SubPc/C60 device with and without a MLA under 1 sun AM1.5G solar illumination. The active layer of the device consists of a bilayer planar heterojunction of 12 nm thick SubPc and 40 nm thick C60. By inclusion of the MLA, the short-circuit current density is significantly improved over a device lacking the MLA from $(4.6\pm0.1)$ mA/cm² to $(5.4+0.2)$ mA/cm², an enhancement of 17%. Combined with minimal increases in the open-circuit voltage ($V_{OC}$) and fill factor (FF), the increased $J_{SC}$ results in a power conversion efficiency increase from $\eta_P=(3.1\pm0.1)\%$ to $(3.7\pm0.1)\%$, or 20%. The external quantum efficiency (EQE) spectra of the devices with and without the MLA, FIG. 10, show that the enhancement occurs across all wavelengths, though it is not constant throughout the spectrum. In general, the enhancement is greater in regions where absorption is relatively weak (e.g. $\lambda>620$ nm) and smaller at wavelengths where the active layer absorb strongly (e.g. at $\lambda\sim575$ nm, the peak of SubPc absorption), in a manner consistent with Beer-Lambert law. For instance, if $\eta_A=60\%$ initially, a hypothetical 50% increase in the optical path length will increase $\eta_A$ to 75%, a relative increase of 25%; if, however, $\eta_A=10\%$ initially, the relative increase will be 46% for the same increase in path length. The reduced EQE near 350 nm for the device with the MLA is caused by absorption of the microlens material. Due to interference between incident light and light reflected off of the metal electrode, the optical intensity inside of the active layer does not decay exponentially as predicted by the Beer-Lambert law. Under normal incidence, interference patterns emerge inside a device with maximum intensity occurring at a distance of approximately:

$$(2m+1)\lambda/4n$$

away from the reflective cathode, where n is the wavelength dependent refractive index and m is 4 an integer indicating the order of interference. When the angle of incidence is shifted by refraction due to the MLA, the peak intensity locations are shifted further from the cathode. This optical field shift can be exploited by tailoring the placement of the heterojunction interface by varying the C60 layer thickness, $t_{C60}$, to adjust the optical intensity profile. As shown in FIG. 11, the relative enhancement in $J_{SC}$ and $\eta_P$ shows a strong dependence on $t_{C60}$, and a maximum enhancement in $\eta_P$ of $(61\pm6)\%$ is obtained for $t_{C60}=80$ nm. Using a modified transfer matrix model to calculate the optical field and the resulting absorption in the device with a MLA, as shown in FIG. 11, both qualitative and quantitative agreements are obtained.

Figure 12:
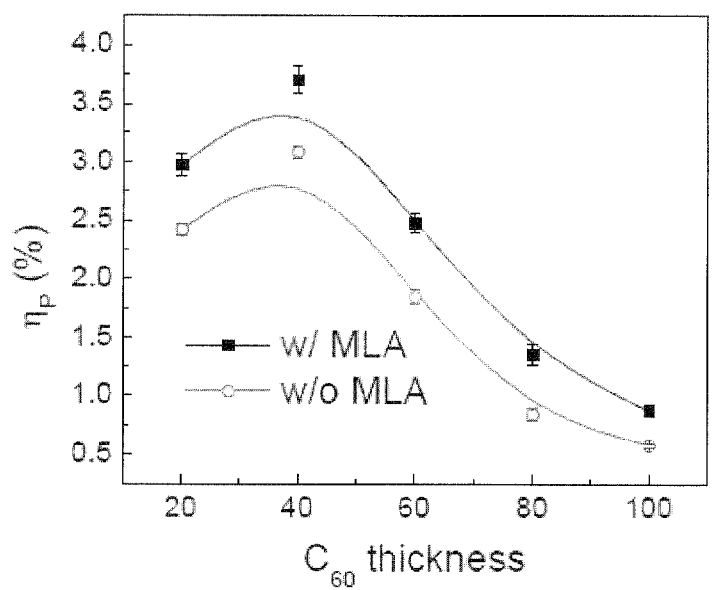
FIG. 12 are plots of the power conversion efficiency $\eta_P$ in a $SubPc/C_{60}$ (12/y nm) for varying $C_{60}$ thicknesses for solar cell with a MLA according to an embodiment of the invention and without a MLA.

In terms of absolute performance, the optimized thickness with a MLA remains at 12 nm SubPc/40 nm $C_{60}$ despite the increased enhancement with thicker $C_{60}$ layers, as shown in FIG. 12. To determine the angular distribution, SubPc:$C_{60}$ (1:4 by weight) active layers of various thicknesses were simulated for 90° contact angle, with 100 µm lens in the MLA. The device, lens array, and illumination areas were treated as infinite by applying periodic boundary conditions. Mixed films were used in place of bilayer SubPc/C60 films for computational simplicity. To correlate results, the total active layer thicknesses were compared (i.e. 20 nm SubPc:$C_{60}$ is comparable to 12 nm SubPc/10 nm $C_{60}$). When a ray is absorbed, its path length through the active layer is recorded and the incident angle was back calculated from the ratio of path length to film thickness. The results follow expectations from the Beer Lambert law. For a very thin device, the proportion of light absorbed with an increased path length is more significant. In a thicker device, a substantial percentage of light with no angular component will be absorbed, making the relative contributions at with longer path lengths less significant. From these results, the relative contributions for rays binned into five different angle groups (centered around 9.6°, 22.4°, 35.2°, 48°, and 60.8°) are calculated and used to weight the short-circuit current values calculated using transfer matrix simulations.

This transfer matrix method is an adequate to approximate the relative enhancements with and without a MLA, although a more rigorous implementation is needed for a fully quantitative simulation.

Figure 13:
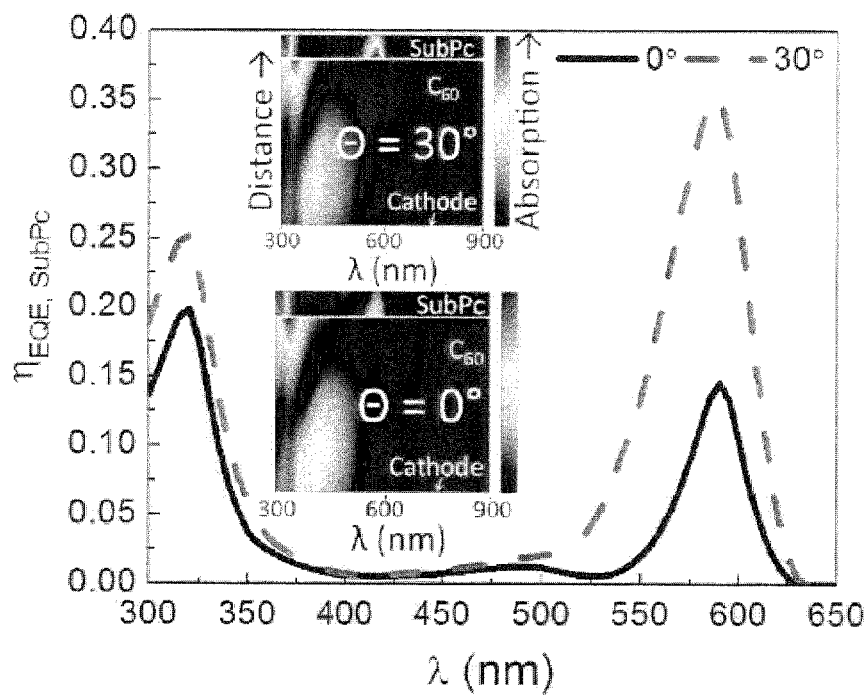
FIG. 13 is a plot of calculated EQEs, using a transfer matrix simulations for a $SubPc/C_{60}$ (12/80 nm) at two different angles of incidence, 30°, to approximate a device with a MLA according to an embodiment of the invention and 0° to approximate a device without a MLA, where the inserts are absorption intensity plots across the active layer at different illumination angles.

To further visualize the effect of the optical field shift, FIG. 13 shows the transfer matrixcalculated EQE within the SubPc layer of a bilayer SubPc/C$_{60}$ device (12/80 nm). Under normal incidence (0°, no MLA), the optical field within the peak SubPc absorption region of 550-600 nm is weak due to the large C$_{60}$ thickness. When the incident angle is changed to 30° (approximating a MLA), this region of the optical field is shifted into the SubPc layer, which drastically increases the quantum efficiency. The enhancement is not only due to the increased path length due to angular incident, as the optical field change is highly beneficial to device performance.

Figure 14:
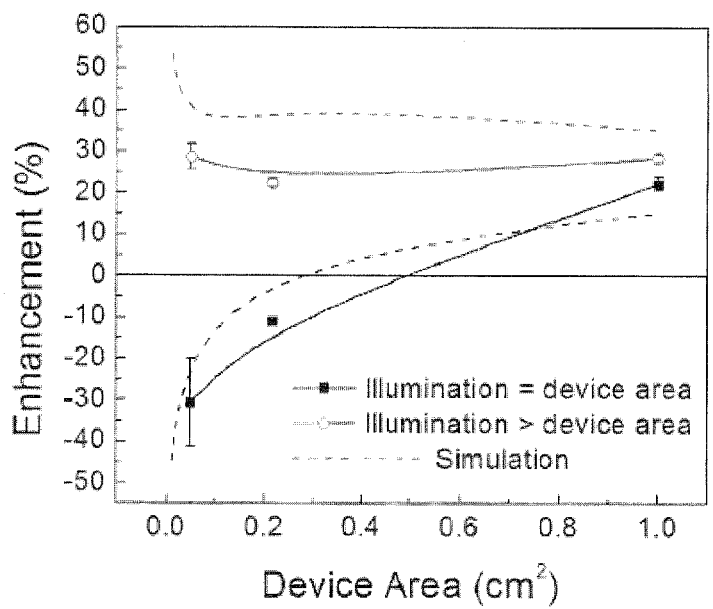
FIG. 14 is a plot of the effect of the device's active area on the relative enhancement with $SubPc/C_{60}$ (12 nm/60 nm) solar cell devices with MLAs according to an embodiment of the invention over solar cells without MLAs, where devices were illuminated with a beam of about 2 inches in diameter to simulate large area illumination relative to the device's area, and where the device is masked off so the area illumination was equal to the active area of the device, where plots of ray optics simulated absorption enhancements (dashed lines) in a 70 nm $SubPc:C_{60}$ (1:4) device is included for comparison.

Microlens arrays introduce several dependencies on the geometric relationship between the illumination, device, and MLA areas. These dependencies arise because the arrays diverge light in a periodic pattern over the illumination area. The even dispersion creates the favorable characteristic where enhancements increase with device area, as loss mechanisms reduce. The effect of device area on J$_{SC}$ enhancement for SubPc/C$_{60}$ (12/60 nm) bilayer devices is shown in FIG. 14 for both large area illumination and device area illumination.

Considering a device where the illumination area is equal to the device area, light near the edge of the device is refracted and diverted outside of the active area; with small area devices, the perimeter length is relatively long compared to the total device area and a large proportion of incident light will be lost. As the device active area becomes larger, the proportion of light lost around the edges decreases accordingly. Some compensation in light loss occurs when the illumination area is larger than the device area, where light can be in-coupled from outside of the device area. Ray optics simulations confirm this compensation. Because of this compensation, the devices described herein are small area devices (~4 mm$^2$) with a large area reflector (2.25 cm$^2$) isolated from the electrodes by a 100 nm thick layer of transparent Cytop fluoropolymer, the geometric characteristics of the tested devices are that of a large area device.

Figure 15:
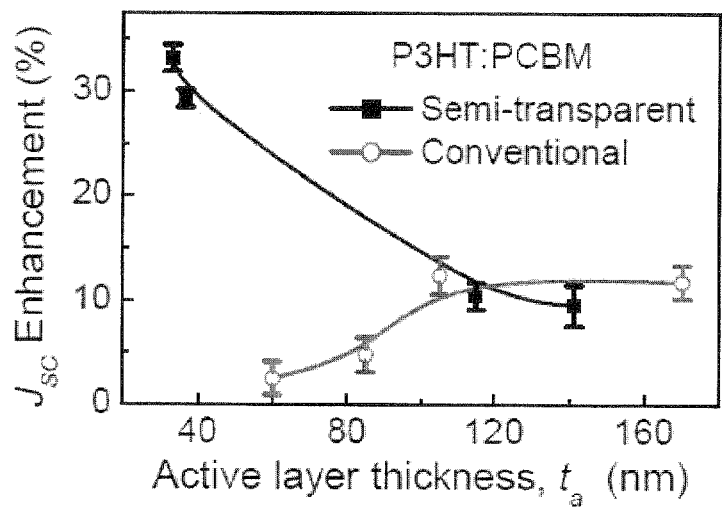
FIG. 15 are plots of the $J_{SC}$ enhancement for various active layer thickness with a MLA according to an embodiment of the invention and without a MLA, for conventional and semi-transparent P3HT:PCBM based devices.

To contrast a planar heterojunction device with a fixed 2-dimensional interface for exciton dissociation as above, a bulk heterojunction poly(3-hexylthiophene):[6,6]-phenyl-C61-butyric acid methyl ester (P3HT:PCBM) devices in which exciton dissociation (and charge generation) occurs throughout the active layer, both conventional and semi-transparent devices were studied. In a conventional device structure, where the reflective metal cathode is used with a transparent anode, a similar enhancement scheme to the SubPc/C60 device, above, was obtained for the P3HT:PCBM device, as indicated in FIG. 15, where optimal enhancement is found when the bulk of the optical field is still within the device active area. With very thin layers, the MLA shifts the optical field outside of the active area, negating any benefit from increased path length. In a semi-transparent device where both electrodes are transparent such that interference is inconsequential in the active layer, a decrease in enhancement due to the MLA occurs as the active layer thickness increases; this is in agreement with expectations consistent with the Beer Lambert relationship.

Figure 16:
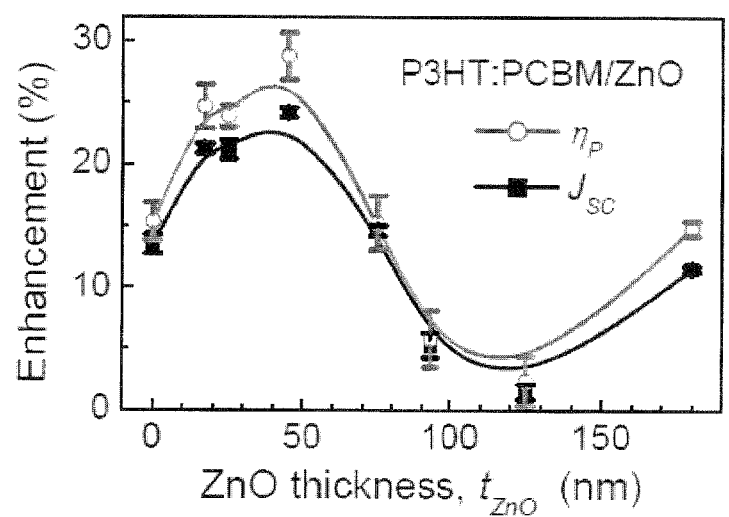
FIG. 16 are plots of the % enhancement of $\eta_P$ and $J_{SC}$ with varying thickness of ZnO electron transporting layers in P3HT:PCBM solar cell devices with MLAs according to an embodiment of the invention.
Figure 17:
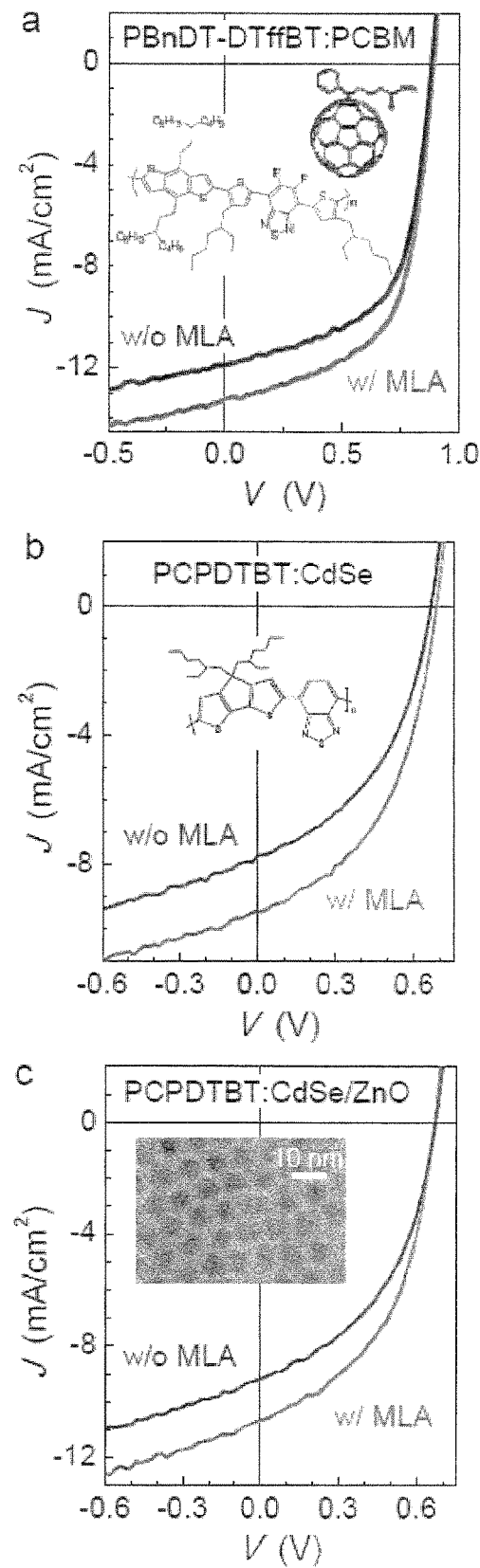
FIG. 17 are Current-voltage curves for solar cells with MLAs according to embodiments of the invention and otherwise equivalent solar cells without MLAs with active layers that are: a) a PBnDT-DTffBT:PCBM high efficiency device (inset: PCBM (left) and PBnDT-DTffBT (right) structures); b) a hybrid PCPDTBT:CdSe polymer: inorganic nanoparticle device without a ZnO optical spacer (inset: PCPDTBT structure); and c) a PCPDTBT:CdSe hybrid device with a 20 nm thick ZnO optical spacer (inset: transmission electron microscopy image of colloidal CdSe nanoparticles of ~7 nm diameter).

For the conventional P3HT:PCBM device, the optical interference effect was further exploited by inserting a transparent ZnO nanoparticle based optical spacer between the active layer and the reflecting aluminum cathode. As shown in FIG. 16, the relative enhancement in J$_{SC}$ and η$_P$ is strong dependent on the ZnO thickness, t$_{ZnO}$, and the maximum enhancement of 28% in η$_P$ is achieved with t$_{ZnO}$=45 nm. The mechanism of enhancement is not specific to the active materials and/or device structure but is due to optical considerations. FIG. 17 shows J-V characteristics for very high efficiency a) polymer:fullerene cells and b) and c) polymer:nanocrystal hybrid cells. Devices with an active layer of poly(benzo[1,2-b:4,5-b']dithiophene)-(5,6-difluoro-4,7-dithien-2-yl-2,1,3-benzothiadiazole) (PBnDT-DTffBT):PCBM show enhancements of η$_P$ from 6.2% to 7.0%, a relative increase of approximately 13%. For hybrid PV cells with active layers consisting of a low gap polymer poly[2,6-(4,4-bis-(2-ethylhexyl)-4H-cyclopenta[2,1-b;3,4-b']dithiophene)-alt-4,7-(2,1,3-benzothiadiazole)] (PCPDTBT) and CdSe nanoparticles (~7 nm diameter), a 17% increase was obtained in η$_P$ with a ZnO optical spacing layer and 30% without any optical spacer. Again, the η$_P$ enhancement in these devices is primarily attributed to the increase in J$_{SC}$, whereas the V$_{OC}$ and FF change only slightly by the inclusion of the MLA. Relevant performance characteristics and enhancements for several devices, with and without a MLA, are listed below in Table 1.

TABLE 1

Comparative Performance and % Enhancement (% E) for Various Solar Cell Devices with and without MLAs

| Architecture | J$_{SC}$ (mA/cm2) w/o MLA | w/ MLA | (%) E | η$_P$ (%) w/o MLA | w/ MLA | (%) E |
|---|---|---|---|---|---|---|
| SubPc/C60 (1) | 4.6 ± 0.2 | 5.4 ± 0.3 | 17 | 3.1 ± 0.2 | 3.7 ± 0.2 | 19 |
| SubPc/C60 (2) | 1.5 ± 0.1 | 2.3 ± 0.1 | 53 | 0.9 ± 0.1 | 1.4 ± 0.1 | 56 |
| P3HT:PCBM (1) | 9.2 ± 0.5 | 10.5 ± 0.5 | 14 | 3.4 ± 0.2 | 3.9 ± 0.2 | 15 |
| P3HT:PCBM (2) | 5.9 ± 0.3 | 7.4 ± 0.4 | 25 | 1.9 ± 0.1 | 2.4 ± 0.1 | 26 |
| PCPDTBT:CdSe (1) | 9.1 ± 0.5 | 10.3 ± 0.5 | 13 | 2.8 ± 0.1 | 3.3 ± 0.2 | 18 |
| PCPDTBT:CdSe (2) | 7.5 ± 0.4 | 9.0 ± 0.5 | 20 | 2.2 ± 0.1 | 2.9 ± 0.2 | 32 |
| PBnDT-DTffBT:PCBM | 11.8 ± 0.6 | 13.1 ± 0.7 | 11 | 6.2 ± 0.3 | 7.0 ± 0.4 | 13 | where:
SubPc/C60 (1) - 12 nm SubPc/40 nm C60, optimized for total performance;
SubPc/C60 (2) - 12 nm SubPc/80 nm C60, optimized for enhancement;
P3HT:PCBM (1) - 100 nm active layer thickness, no ZnO optical spacing, optimized for total performance;
P3HT:PCBM (2) - 100 nm active layer thickness, 45 nm ZnO, optimized for enhancement;
PCPDTBT:CdSe (1) - 85 nm active layer thickness, 20 nm ZnO;
PCPDTBT:CdSe (2) - 85 nm active layer thickness, no ZnO;
PBnDT-DTffBT:PCBM - 140 nm active layer thickness.

Figure 18:
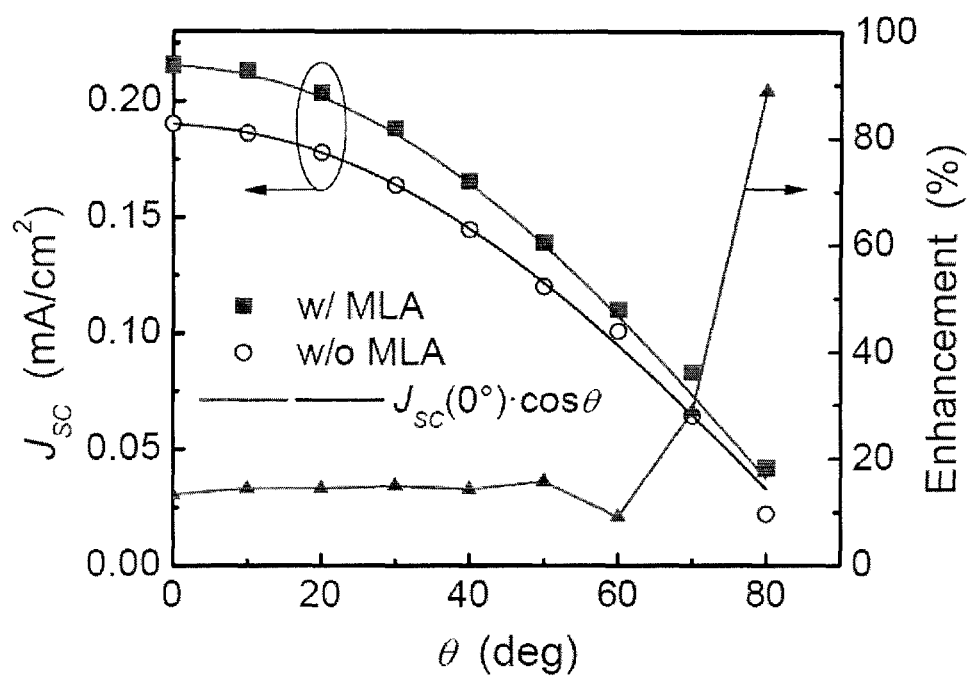
FIG. 18 shows plots of $J_{SC}$ indicating the performance of a 1 $cm^2$SubPc/$C_{60}$ (12 nm/40 nm) device under angled incidence of uniform, low-intensity (~5 mW/$cm^2$) white light with and without a microlens array and a plot of the relative enhancement at various incident angles.

Recognizing that the solar illumination angle varies throughout the day for a PV module without a solar tracking system, the dependence of enhancement on the incident light direction was examined. As shown in FIG. 18, for a 1 cm$^2$ bilayer SubPc/C$_{60}$ device without a MLA under ~5 mw/cm$^2$ white light illumination, shows a monotonic decrease in J$_{SC}$ as the tilt angle is increased, closely following a the equation:

$$J_{SC}(\theta) = J_{SC}(0)\cos(\theta);$$

which suggests a compensation between increased surface reflectivity and increased path length through the active layer. This relationship deviates at very high incident angles, where surface reflection dominates. With a MLA, the situation is similar until at large angles, where the measured current outperforms the cos(θ)dependence. Enhancement in J$_{SC}$ is mostly constant for θ<50°, but sharply increases from ~15% for θ<60° to 90% at θ=80°. This enhancement is attributed to the curved lens surface effectively reducing the reflection of high angle incident light.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A thin film solar cell, comprising:
a transparent microlens array (MLA) layer;
a transparent substrate including an upper surface and a lower surface opposite the upper surface, the upper surface being an essentially flat transparent light receiving surface;
a transparent electrode directly contacting the lower surface of the transparent substrate;
an active layer; and
a distal reflective electrode;
wherein the MLA layer comprises an array of lenses comprising a multiplicity of hemisphere lenses of equal or different sizes, a lower flat surface of the array of lenses directly contacts the essentially flat transparent light receiving surface of the transparent substrate;
wherein at least 60% of the essentially flat transparent light receiving surface is occupied by the array of lenses;
wherein the transparent electrode, the active layer, and the distal reflective electrode are continuous essentially flat layers;
wherein the diameter of each of the multiplicity of hemisphere lenses of the array of lenses is less than the thickness of the transparent substrate; and
wherein the MLA layer is configured not to focus light to a particular spot or area in the thin film solar cell.

2. The thin film solar cell of claim 1, wherein each lens of the array of lenses are of equal diameter.

3. The thin film solar cell of claim 1, wherein the hemisphere lenses are of a plurality of diameter.

4. The thin film solar cell of claim 1, wherein the MLA layer comprises a photo-cured resin or a thermal-cured resin.

5. The thin film solar cell of claim 1, wherein the MLA layer comprises $TiO_2$ nanoparticles, $ZrO_2$ nanoparticles, $CeO_2$ nanoparticles, lead zirconate tinate (PZT) nanoparticles, or any combination thereof.

6. The thin film solar cell of claim 1, wherein the active layer comprises an inorganic semiconducting thin film that is amorphous, nanocrystalline, microcrystalline, or polycrystalline and said inorganic semiconducting thin film comprises silicon, silicon germanium, CdTe, CdS, GaAs, $Cu_2S$, $CuInS_2$, $Cu(In_xGa_{1-x})Se_2$, or CuZnSn(S,Se).

7. The thin film solar cell of claim 1, wherein the active layer comprises organic semiconducting thin films based on organic compounds or conjugated polymers.

8. The thin film solar cell of claim 1, wherein the active layer comprises hybrid organic-inorganic semiconducting thin films containing inorganic nanoparticles and conjugated polymers or molecules.

9. The thin film solar cell of claim 1, wherein the distal reflective electrode comprises a reflective metal.

10. The thin film solar cell of claim 1, wherein the transparent substrate comprises transparent surface is of a substrate comprising glass, plastic or thermoset resin.

11. The thin film solar cell of claim 10, wherein the MLA layer and the transparent substrate are the same material.

12. The thin film solar cell of claim 1, wherein the transparent electrode comprises tin-doped indium oxide (ITO), fluorine-doped tin oxide (FTO), aluminum-doped zinc oxide (AZO), gallium doped zinc oxide (GZO), graphene, carbon nanotubes, conductive polymers, metal oxide/metal/metal oxide multi-layers, metallic gratings, or metallic nanowire networks.

* * * * *